(12) United States Patent
Harada (10) Patent No.: US 7,926,973 B2
(45) Date of Patent: Apr. 19, 2011

(54) SEMICONDUCTOR LIGHT EMITTING APPARATUS

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 405 days.

(21) Appl. No.: 12/036,556

(22) Filed: Feb. 25, 2008

(65) Prior Publication Data

US 2008/0203419 A1 Aug. 28, 2008

(30) Foreign Application Priority Data

Feb. 28, 2007 (JP) ................................ 2007-049511

(51) Int. Cl.
*F21V 9/00* (2006.01)
(52) U.S. Cl. ..................... 362/231; 362/293; 362/311.02
(58) Field of Classification Search .................. 362/293, 362/217.05, 296.01, 300, 307, 311.01, 311.03, 362/341, 343, 311.02, 231, 244, 245, 246, 362/24.02, 235, 236; 313/512
See application file for complete search history.

(56) References Cited

U.S. PATENT DOCUMENTS

| | | | | |
|---|---|---|---|---|
| 6,759,804 B2 * | 7/2004 | Ellens et al. | ................... | 313/512 |
| 7,070,804 B2 * | 7/2006 | Gianesello et al. | ........... | 424/464 |
| 7,445,354 B2 * | 11/2008 | Aoki et al. | ................... | 362/241 |
| 2005/0001532 A1 * | 1/2005 | Srivastava et al. | ............ | 313/484 |

FOREIGN PATENT DOCUMENTS

| | | |
|---|---|---|
| JP | 2001077433 | 3/2001 |
| JP | 2006165416 | 6/2006 |

* cited by examiner

*Primary Examiner* — John A Ward
(74) *Attorney, Agent, or Firm* — Kenealy Vaidya LLP (57) ABSTRACT

A semiconductor light emitting apparatus can be configured to reduce color variations and intensity variations with a simple configuration. The semiconductor light emitting apparatus can include a substrate having conductive members including chip mounting areas and electrode areas, a plurality of semiconductor light emitting device chips mounted in the chip mounting areas on the substrate, a reflector formed on this substrate so as to surround the semiconductor light emitting device chips, and a fluorescent material and a light diffusing material arranged distributedly inside this reflector. The semiconductor light emitting apparatus can be configured so that the semiconductor light emitting device chips emit light only from their top surfaces, and a first light transmitting resin containing the fluorescent material is applied only to the top surfaces of the semiconductor light emitting device chips.

10 Claims, 5 Drawing Sheets

SEMICONDUCTOR LIGHT EMITTING APPARATUS

This application claims the priority benefit under 35 U.S.C. §119 of Japanese Patent Application No. 2007-049511 filed on Feb. 28, 2007, which is hereby incorporated in its entirety by reference.

BACKGROUND

1. Field

The presently disclosed subject matter relates to a semiconductor light emitting apparatus which emits light from semiconductor light emitting devices through a wavelength converting material and a light diffusing material.

2. Description of the Related Art

Conventionally, semiconductor light emitting apparatuses have been disclosed, for example, in Japanese Patent No. 3,690,968 (corresponding to Japanese Patent Application Laid-Open No. 2001-077433) and Japanese Patent Application Laid-Open No. 2006-165416.

More specifically, in Japanese Patent No. 3,690,968, a semiconductor light emitting apparatus is configured to include the following: a substrate having a cavity in its surface; a semiconductor light emitting device mounted on the cavitied-surface of the substrate, or into the cavity recess; and a translucent mold member filled in the cavity recess, the material containing a fluorescent material and a light diffusing material.

In this instance, the above mentioned fluorescent material has a specific gravity higher than those of the translucent mold member and the diffusing material. In the translucent mold member which is cured inside the cavity recess, it is possible to provide a concentration gradient of the fluorescent material. Accordingly, the fluorescent material increases in concentration as it approaches the semiconductor light emitting device below. The light diffusing material increases in concentration as it approaches the top of the translucent mold member above.

According to the semiconductor light emitting apparatus having such a configuration, when the semiconductor light emitting device emits light, the light from the semiconductor light emitting device is incident on the fluorescent material to excite the fluorescent material. As a result, the fluorescent material emits fluorescence with a predetermined color, which is scattered by the light diffusing material and emitted outside from the surface of the translucent mold member.

In this instance, the light diffusing material is configured to have a function of reflecting light from outside and a function of scattering fluorescence that is emitted from the fluorescent material when excited by the light emitted from the semiconductor light emitting device.

On the other hand, the semiconductor light emitting apparatus disclosed in Japanese Patent Application Laid-Open No. 2006-165416 is manufactured by the following process steps. An open-ended hollow lamp house having openings shaped like numerals, letters, or the like in its surface is placed with the surface side down. Then, a transparent resin material containing a diffusing material and a fluorescent material is injected into the hollow area of this lamp house. Next, electrode members having an LED chip mounted thereon are set into the hollow area of the lamp house. In this state, the lamp house is put into a constant-temperature bath to precipitate the fluorescent material on the surface side, and the transparent resin material is cured to complete the semiconductor light emitting apparatus.

In either of the semiconductor light emitting apparatuses disclosed in Japanese Patent No. 3,690,968 and Japanese Patent Application Laid-Open No. 2006-165416, the translucent mold member or the transparent resin material (light transmitting resin) is mixed with a fluorescent material and cured. In this case, the fluorescent material precipitates by gravity based on a difference between the specific gravities of the light transmitting resin and the fluorescent material, thereby forming a fluorescent material layer having a high concentration of fluorescent material.

Nevertheless, in the semiconductor light emitting apparatus disclosed in Japanese Patent No. 3,690,968, the fluorescent material is also deposited on areas of the substrate surface other than the semiconductor light emitting device. Accordingly, these areas are higher in the concentration of the fluorescent material as compared to the top of the semiconductor light emitting device. Namely, this area of fluorescent material causes higher fluorescence when the semiconductor light emitting device is lighted, as compared to the fluorescence from the top of the semiconductor light emitting device.

For example, when a combination of a blue light emitting device and a yellow fluorescent material is used in this type of semiconductor light emitting apparatus for achieving white light, this configuration can result in more yellowish color, causing color variations in terms of the entire light emitting surface of the semiconductor light emitting apparatus.

Because these areas are located around the light emitting device, the light emitted from the device cannot enter these areas easily. Accordingly, these areas are low in the intensity of excitation by the semiconductor light emitting device in spite of the high concentration of the fluorescent material. This lowers the intensity of the fluorescence, causing significant intensity variations in terms of the entire light emitting surface of the semiconductor light emitting apparatus.

Moreover, if a diffusion sheet is overlaid on the light emitting surface of the foregoing semiconductor light emitting apparatus for the purpose of a backlight intended for a liquid crystal display, the color variations and the intensity variations mentioned above can be reduced comparatively. Nevertheless, when high-current power LEDs are used as the semiconductor light emitting device and built into the optical system of a reflector, projector, and the like, the foregoing color variations and intensity variations may appear in greater significance and may deteriorate the quality of the semiconductor light emitting apparatus used as a light source.

In the semiconductor light emitting apparatus disclosed in Japanese Patent Application Laid-Open No. 2006-165416, the fluorescent material is deposited only in the display areas of the numerals, letters, etc. The fluorescent material varies in concentration, however, depending on the shapes and dimensions of the display areas. The apparatus causes color variations and intensity variations similarly, and thus cannot be used as a surface light source.

SUMMARY

In view of the foregoing, there is a long felt need in the art to provide a semiconductor light emitting apparatus which can reduce color variations and intensity variations with a simple configuration.

According to an aspect of the presently disclosed subject matter, a semiconductor light emitting apparatus can include: a substrate having a conductive member for making a chip mounting area and an electrode area; a semiconductor light emitting device chip mounted in the chip mounting area on this substrate; a reflector formed on this substrate so as to surround the semiconductor light emitting device chip; and a wavelength converting material and a light diffusing material arranged distributedly inside this reflector, wherein the semiconductor light emitting device chip emits light only or substantially only from its top surface, and a first light transmitting resin containing the wavelength converting material is applied only or substantially only to the surface of the semiconductor light emitting device chip. By the thus configured semiconductor light emitting apparatus, certain characteristics and features can be achieved.

In a semiconductor light emitting apparatus made in accordance with principles of the presently disclosed subject matter, the first light transmitting resin containing the wavelength converting material alone may be coated and cured on the top of the semiconductor light emitting device chip so as to bulge upward due to surface tension.

A second light transmitting resin containing the light diffusing material alone may be filled into the reflector so as to cover the first light transmitting resin.

The reflector can have a step in an upper part of an inner surface thereof, and a light diffusion sheet containing the light diffusing material may be placed on the step so as to cover an interior of a recess in the reflector.

An inert gas may be sealed in the recess of the reflector.

The reflector may have a height 1.0 to 2.0 times that of the semiconductor light emitting device chip.

The wavelength converting material may be a fluorescent material.

According to the foregoing configuration, the semiconductor light emitting device chip can emit light when a drive voltage is applied to the semiconductor light emitting device chip through the conductive members on the substrate. The light emitted from the semiconductor light emitting device chip can be transmitted through the first light transmitting resin containing the wavelength converting material (or fluorescent material, hereinafter for simplicity) and emitted outside.

On that occasion, part of the light emitted from the semiconductor light emitting device chip can impinge on the fluorescent material to excite the fluorescent material. As a result, the fluorescent material can emit fluorescence. The fluorescence from the fluorescent material may be mixed in color with the light emitted from the semiconductor light emitting device chip, and may be diffused further by the light diffusing material in the reflector. Consequently, the two light emissions can be mixed in color and emitted outside.

In this instance, the concentration of the fluorescent material in the first light transmitting resin applied to the top of the semiconductor light emitting device chip can be easily controlled, for example, by the amount of application of the first light transmitting resin to the top of the semiconductor light emitting device chip in a dispenser system or the like.

Consequently, the mixed-color light can be made almost uniform in color, because the light emitted from the top of the semiconductor light emitting device chip excites the fluorescent material contained in the first light transmitting resin applied to the top immediately after emission in addition to the appropriate amount of contained fluorescent material. This can reduce the occurrence of color variations.

In addition, this mixed-color light is sufficiently diffused by the light diffusing material which is arranged distributedly inside the reflector, and intensity variations can thus be reduced near the top of the reflector.

In the above configuration, the semiconductor light emitting device chip can emit light only or substantially only from its top surface and the first light transmitting resin containing the fluorescent material alone or substantially alone can be cured on the top of the semiconductor light emitting device chip so as to bulge upward due to surface tension. Accordingly, the intensity of the light emitted from the semiconductor light emitting device chip can be almost uniform with respect to the emission angle, and the concentration of the fluorescent material can be almost uniform with respect to this light. This can further reduce the occurrence of color variations.

When the second light transmitting resin containing the light diffusing material alone or substantially alone is filled into the reflector so as to cover the first light transmitting resin, the semiconductor light emitting device chip can be sealed and protected by this second light transmitting resin in the reflector, and the light diffusing material can be arranged distributedly inside the reflector.

When the reflector has a step in the upper part of its inner surface, and a light diffusion sheet containing the light diffusing material is placed on this step so as to cover the interior of the recess in the reflector, it follows that a card of light diffusing material lies near the top of the reflector. Consequently, the light emitted from the semiconductor light emitting device chip can be scattered when it is transmitted through the light diffusion sheet near the external emission surface. This allows a reduction of intensity variations.

When an inert gas is sealed in the recess of the reflector, the semiconductor light emitting device chip, even when not sealed within a resin, can be surrounded by the inert gas in the reflector. This can prevent the semiconductor light emitting device chip from contact with air, thereby protecting it from oxidation and the like.

When the reflector has a height 1.0 to 2.0 times that of the semiconductor light emitting device chip, intensity variations can be effectively suppressed at the light emitting surface at the top of the reflector without lowering the output efficiency of the light from the semiconductor light emitting device chip.

As described above, and in accordance with an aspect of the presently disclosed subject matter, the first light transmitting resin containing the fluorescent material alone can be applied only to the top of the semiconductor light emitting device chip while the light diffusing material can be arranged distributedly inside the reflector. This can reduce color variations and intensity variations of the mixed-color light emitted upward from the top of the reflector, thereby providing uniform plane emission which is suitable for, for example, a surface light source.

BRIEF DESCRIPTION OF THE DRAWINGS

These and other characteristics, features, and advantages of the presently disclosed subject matter will become clear from the following description with reference to the accompanying drawings, wherein.

DETAILED DESCRIPTION OF EXEMPLARY EMBODIMENTS

Hereinafter, exemplary embodiments of the presently disclosed subject matter will be described in detail with reference to FIGS. 1 to 6.

Figure 1:
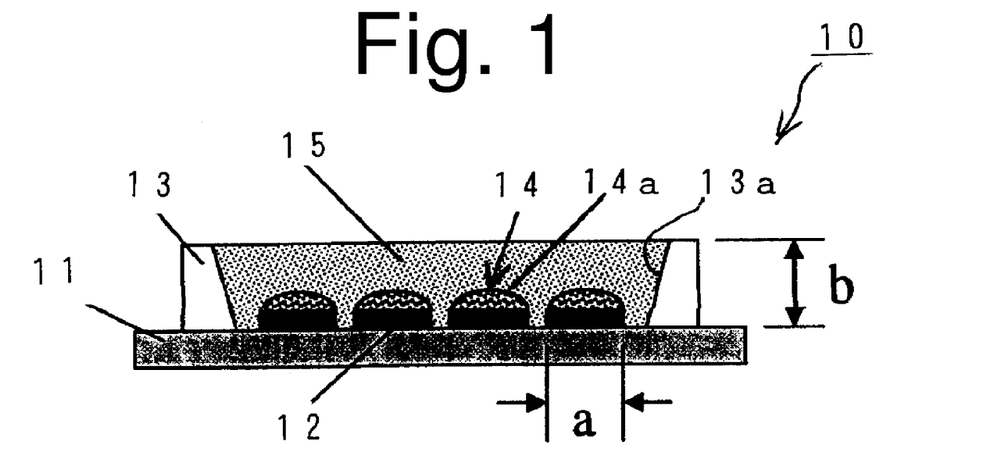
FIG. 1 is a schematic cross-sectional view showing a configuration of a first exemplary embodiment of a semiconductor light emitting apparatus made in accordance with principles of the presently disclosed subject matter.
Figure 2:
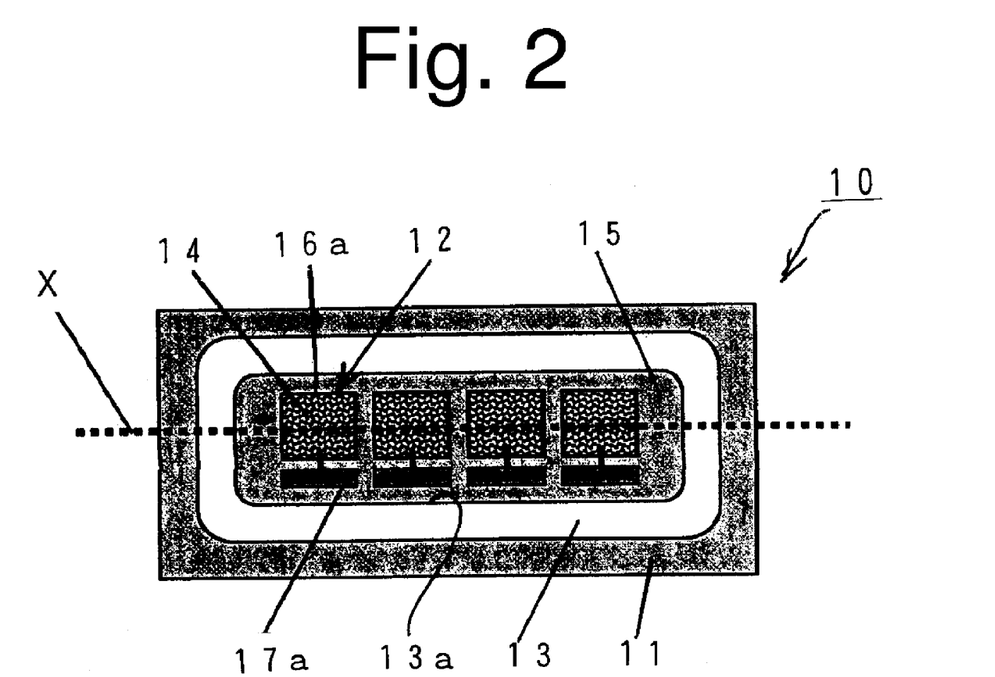
FIG. 2 is a schematic plan view of the semiconductor light emitting apparatus of FIG. 1.

FIGS. 1 and 2 show a configuration of a first exemplary embodiment of a semiconductor light emitting apparatus made in accordance with principles of the presently disclosed subject matter.

In FIGS. 1 and 2, the semiconductor light emitting apparatus 10 can be configured to include: a substrate 11; a plurality (four, in the shown case) of LED chips 12 configured as semiconductor light emitting device chips mounted on the substrate 11; a frame-shaped reflector 13 which is formed on the substrate 11 so as to surround the LED chips 12; a wavelength converting material layer or fluorescent material layer 14 arranged on the top of each LED chip 12; and a light diffusion layer 15 containing a light diffusing material and arranged in a recess 13a of the reflector 13.

The substrate 11 can be a flat wiring board made of a material having high thermal conductivity, such as aluminum oxide, aluminum nitride, silicon carbide, silicon nitride, zirconium oxide, silicon, or the like. Conductive patterns can be formed on the surface and/or inside the board as conductive members.

As shown in FIG. 2, these conductive patterns can include: chip mounting areas 16a and electrode areas 17a at the tops of their extremities; and surface-mounting terminal portions (not shown) which extend from the above-described mounting and/or electrode areas to the top or bottom via both side edges.

The foregoing LED chips 12 can be formed by depositing a PN semiconductor layer on a nontransparent substrate, for example. The LED chips 12 can have light emitting surfaces at their tops alone (or substantially alone), and do not substantially emit light from the chip sides.

The LED chips 12 can be bonded onto the chip mounting areas 16a of the one (or plural) conductive pattern(s) of the substrate 11 by die-bonding or the like, using a bonding material such as an Au—Sn alloy, Pb-free solder, an Ag paste, or the like. Electrode areas at their surfaces can also be electrically connected to the electrode areas 17a of the other conductive pattern by wire bonding with gold wires or the like.

The reflector 13 can have a recess 13a which is formed to surround or substantially surround the periphery of the LED chips 12 with its inner surface tilted to spread out upward.

The reflector 13 can be made of a material having high reflectivity, or alternatively the inner surface of the recess 13a can be plated with a material having high reflectivity to serve as a reflecting surface.

The fluorescent material layer 14 can be formed by mixing particles of fluorescent material 14a into a light transmitting resin such as epoxy resin, silicone, etc. It is applied to the tops of the LED chips 12 using a general-purpose dispenser system or the like, followed by curing.

The fluorescent material serving as a wavelength converting material may be formed of ZnS:Cu, SiAlON:Eu, $Ca_3Sc_2(SiO_4)_3$:Ce, silicate, or other known wavelength conversion material.

In this case, the LED chips 12 can be shaped by mechanical dicing, laser scribing, or the like, typically in a fine processing step on a wafer so as to form right-angled edges on the chips 12. The fluorescent material layer 14 applied to the tops of these LED chips 12 can thus be formed to bulge out thickly due to the surface tension of the light transmitting resin.

In general, LED chips have been increasing in size and requiring increased LED current in recent years. With chip sizes of 1-mm square or so, it is therefore possible to sufficiently apply the fluorescent material layer in a quantitative fashion using a dispenser system.

The light diffusion layer 15 can be formed by mixing a light diffusing material into a light transmitting resin such as epoxy resin, silicone, etc. It can be filled into the recess 13a of the reflector 13 and cured by heating, for example.

In this instance, the light diffusing material can be made of a material having a refractive index different from that of the light transmitting resin, such as fine powders of silicon oxide, aluminum oxide, titanium oxide, silicone beads, etc.

The semiconductor light emitting apparatus 10 according to the present embodiment made in accordance with principles of the presently disclosed subject matter can be configured as described above. The LED chips 12 can emit light when a drive voltage is applied to the respective LED chips 12 through the pair of conductive patterns.

The light emitted from the top of each LED chip 12 can be incident on the fluorescent material layer 14, and part of it can impinge on the particles of the fluorescent material 14a in the fluorescent material layer 14 to excite the fluorescent material.

As a result, the fluorescent material can emit fluorescence, which is mixed with the light directly emitted from each LED chip 12 and is directed through the fluorescent material layer 14 and into the light diffusion layer 15.

In this case, the light emitted from each LED chip 12 can be incident on the fluorescent material layer 14 immediately after emission, excite the fluorescent material 14a, and make the fluorescent material 14a emit fluorescence.

The fluorescent material layer 14 can be thickly formed by surface tension. This can provide a sufficient concentration of fluorescent material corresponding to the light emitted from each LED chip 12. This also makes the amount of fluorescence emitted from the fluorescent material 14a sufficient.

Moreover, in this embodiment, the fluorescent material 14a lies in the fluorescent material layer 14 alone, not in the light diffusion layer 15. This can reduce the occurrence of color variations.

In this way, the mixed-color light incident on the light diffusion layer 15 (being a mixture of direct light emitted from the LED and fluorescence emitted from the fluorescent material) can be emitted directly or sideways, reflected from the inner surface of the recess 13a in the reflector 13, and then emitted outside from the top of the light diffusion layer 15.

On that occasion, part of the mixed-color light incident on the light diffusion layer 15 can impinge on the particles of the light diffusing material in the light diffusion layer 15 and scatters. The mixed-color light can thus be diffused sufficiently in the light diffusion layer 15 before being emitted outside from the top of the light diffusion layer 15.

As a result, the light emitted outside from the top of this light diffusion layer 15 can fully cover the areas between the individual LED chips 12 because of the diffusion by the light diffusion layer 15, thereby suppressing any partial drop in intensity in the semiconductor light emitting apparatus 10.

In this way, variations in the intensity of the light emitted from the top of the light diffusion layer 15 can be efficiently reduced. Furthermore, such scattering can also further reduce color variations.

Figure 3:
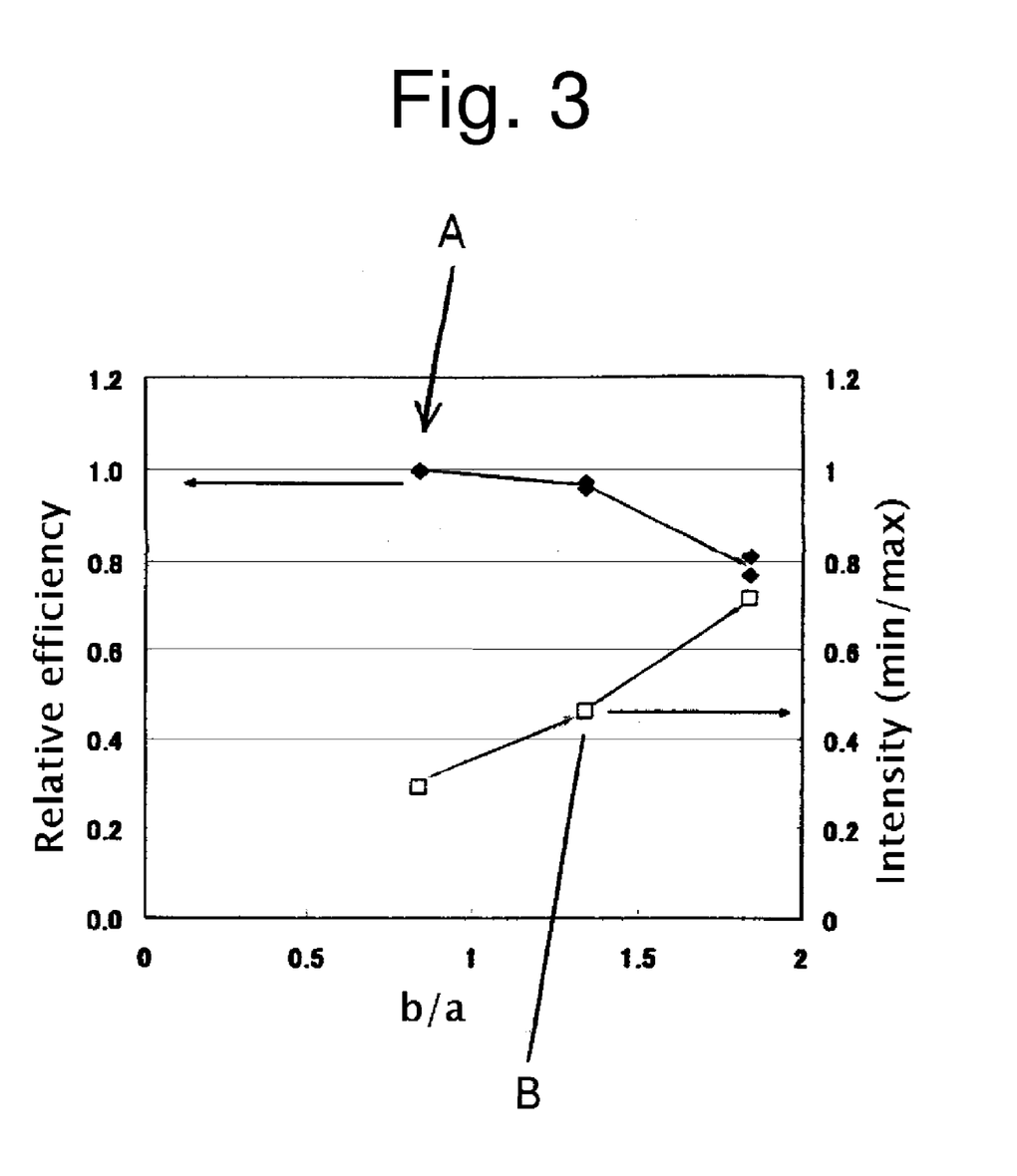
FIG. 3 is a graph showing relative efficiency and intensity variations for the semiconductor light emitting apparatus of FIG. 1 when the ratio between the size of the LED chips and the height of the reflector is changed.

FIG. 3 is a graph showing relative efficiency and intensity variations (the ratio of minimum intensity to maximum intensity) of the foregoing semiconductor light emitting apparatus 10 when the height "b" of the reflector 13 is changed with respect to the size "a" of the LED chips 12.

As shown by the reference symbol A, the relative efficiency is an indicator of the light output efficiency of the LEDs. It drops gradually as the ratio of b/a increases, i.e., the height "b" of the reflector 13 increases.

In contrast, intensity variations decrease as the value approaches 1. The greater the height "b" of the reflector, the closer the intensity variation ratio approaches 1.

In order to suppress intensity variations without lowering the LED relative efficiency, it is sometimes desirable that the ratio of b/a fall within the range of 1.0 to 2.0.

A description will now be given of experiments for measuring the foregoing semiconductor light emitting apparatus 10 for intensity and chromaticity in its longitudinal direction (the direction shown by the dotted line X in FIG. 2).

Initially, using LED chips 12 having a size a of 1 mm and a reflector 13 having a height b of 1.5 mm, a semiconductor light emitting apparatus of conventional structure was fabricated. The conventional apparatus was formed by filling a light transmitting resin containing a fluorescent material and a light diffusing material into a reflector so that the fluorescent material precipitated on the entire surface of each of the LED chips and the substrate, and thermally curing the same. Furthermore, a semiconductor light emitting apparatus according to the exemplary embodiment of the presently disclosed subject matter shown in FIG. 1 was fabricated. The semiconductor light emitting apparatuses were each measured for intensity and chromaticity in the longitudinal direction, followed by normalization.

Figure 4:
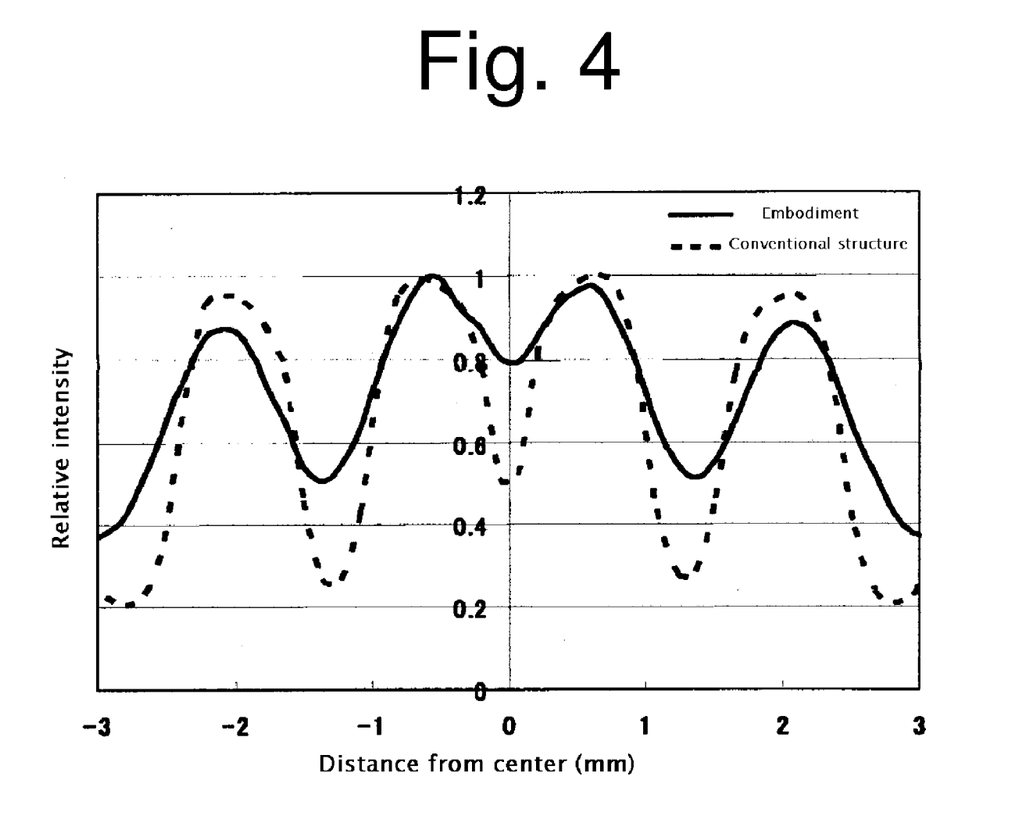
FIG. 4 is a graph showing measurements of intensity distribution in a longitudinal direction for the semiconductor light emitting apparatus of FIG. 1.

For intensity, as shown in FIG. 4, the semiconductor light emitting apparatus 10 according to the exemplary embodiment of the presently disclosed subject matter showed an intensity distribution characteristic shown by the solid line. The semiconductor light emitting apparatus of the conventional structure showed an intensity distribution characteristic shown by the dotted line.

As compared to the semiconductor light emitting apparatus of the conventional structure, it is seen that the semiconductor light emitting apparatus 10 according to the exemplary embodiment of the presently disclosed subject matter suppresses intensity drops between the LED chips 12 by the scattering of light in the light diffusion layer 15.

Figure 5:
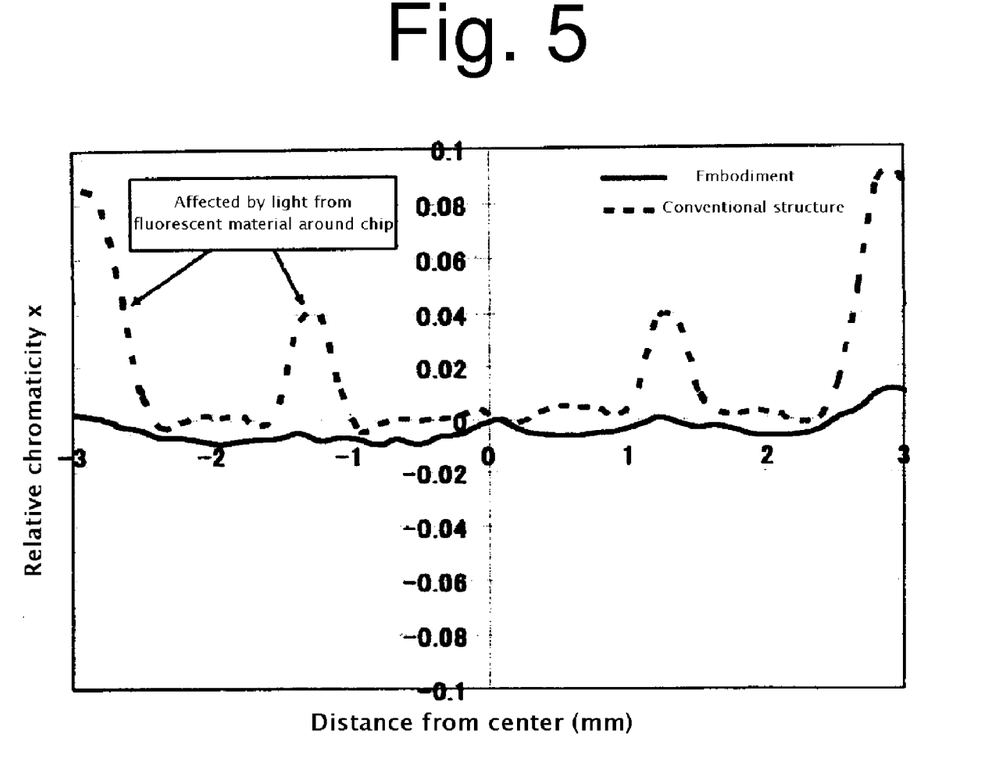
FIG. 5 is a graph showing measurements of chromaticity distribution in a longitudinal direction for the semiconductor light emitting apparatus of FIG. 1.

For chromaticity, as shown in FIG. 5, the semiconductor light emitting apparatus 10 according to the exemplary embodiment of the presently disclosed subject matter showed a chromaticity distribution characteristic shown by the solid line. The semiconductor light emitting apparatus of the conventional structure showed a chromaticity distribution characteristic shown by the dotted line.

It can thus be seen that the semiconductor light emitting apparatus of the conventional structure causes chromaticity variations due to the light emitted from the fluorescent material that precipitated on the top of the substrate and around the LED chips. In contrast, the semiconductor light emitting apparatus 10 according to the exemplary embodiment of the presently disclosed subject matter suppresses chromaticity variations around the LED chips 12.

Second Exemplary Embodiment

Figure 6:
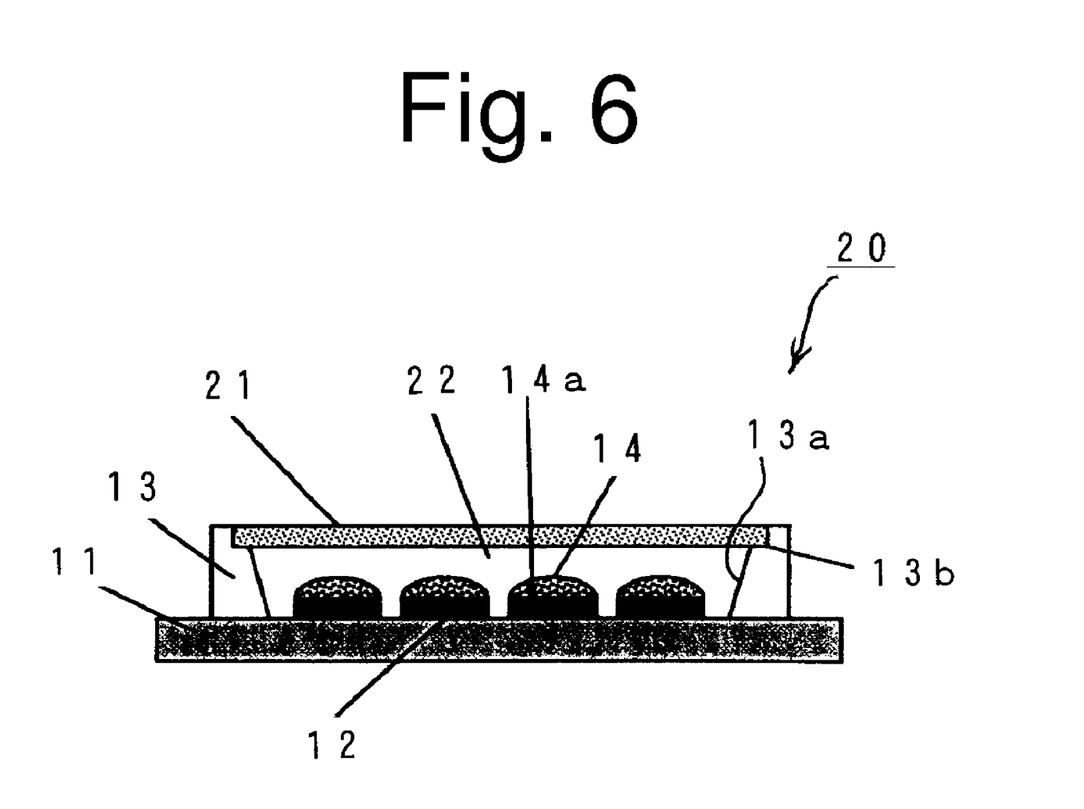
FIG. 6 is a schematic sectional diagram showing a configuration of a second exemplary embodiment of a semiconductor light emitting apparatus made in accordance with principles of the presently disclosed subject matter.

FIG. 6 shows the configuration of a second exemplary embodiment of a semiconductor light emitting apparatus made in accordance with principles of the presently disclosed subject matter.

In FIG. 6, the semiconductor light emitting apparatus 20 has almost the same configuration as that of the semiconductor light emitting device 10 shown in FIGS. 1 and 2. A difference lies in the provision of a light diffusion sheet 21 which is arranged near the top of the reflector 13 and an inert gas 22 which is sealed in the recess 13a of the reflector 13, instead of the light diffusion layer 15.

In this case, the light diffusion sheet 21 can be formed in the shape of a flat plate, for example, using frosted glass, opalescent glass, a silicone resin with a dispersed light-scattering material, or the like.

It should be appreciated that the light diffusion sheet 21 may be made of a material having heat resistance of approximately 300° C. or above so as to allow a solder reflow mount process when performing mounting during manufacture of this semiconductor light emitting apparatus 20.

The light diffusion sheet 21 can be placed with its periphery on a step 13b which is formed around the top edge of the inner surface of the recess 13a in the reflector 13. It can be bonded to the step 13b, for example, with an epoxy adhesive, a silicone adhesive, a low-melting glass, or the like.

The inert gas 22 can be made of nitrogen, argon gas, or the like, for example, and can be sealed in the recess 13a of the reflector 13 by a sealing step of bonding the periphery of the light diffusion sheet 21 to the step 13b of the reflector 13 to seal the interior of the recess 13a of the reflector 13.

In this case, the inert gas 22 can be sealed into the recess 13a of the reflector 13 by preparing the interior of the sealing system in the inert gas atmosphere, or locally injecting the inert gas into the recess 13a of the reflector 13 from a gas supply nozzle or the like immediately before placing the light diffusion sheet 21 onto the step 13b of the reflector 13.

The semiconductor light emitting apparatus 20 having such a configuration can provide almost the same operation as that of the semiconductor light emitting apparatus 10 shown in FIGS. 1 and 2. In addition to this, the mixed-color light emitted from the LED chips 12 into the recess 13a of the reflector 13 through the fluorescent material layer 14 (being a mixture of direct light emitted from the LED and fluorescence emitted from the fluorescent material) can be scattered by the light diffusion sheet 21 when emitted upward through the light diffusion sheet 21 directly or by reflection from the inner surface of the recess 13a of the reflector 13.

As a result, the light that is to be emitted outside of the apparatus 20 can be scattered as with the light diffusion layer 15 of the semiconductor light emitting apparatus 10 shown in FIGS. 1 and 2. This can consequently reduce color variations and intensity variations of the light emitted from the semiconductor light emitting apparatus 20.

Moreover, the LED chips 12 mounted in the recess 13a of the reflector 13 can be sealed in the recess 13a of the reflector 13 with the inert gas 22. This can provide protection against oxidation and the like.

The foregoing exemplary embodiments have dealt with cases where four LED chips 12 are arranged in line inside the reflector 13. This is not restrictive, however, and it is understood that one to three LED chips 12 or more than four may be provided.

Moreover, the foregoing exemplary embodiments have dealt with cases in which LED chips 12 are used as the semiconductor light emitting device chips. This is not restrictive, however, and other types of semiconductor light emitting device chips, such as a semiconductor laser device chip, may also be used.

As described above, according to certain embodiments of the presently disclosed subject matter, it is possible to provide an excellent semiconductor light emitting apparatus which can reduce color variations and intensity variations with a simple configuration.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents. All related art references described above are hereby incorporated in their entirety by reference.

What is claimed is:

1. A semiconductor light emitting apparatus comprising:
   a substrate having a conductive member including a chip mounting area and an electrode area;
   a semiconductor light emitting device chip located adjacent the chip mounting area on the substrate and the semiconductor light emitting device chip having a top surface, a bottom surface opposed to the top surface, and a side surface extending downward and at an angle with respect to the top surface and continuously from the top surface to the bottom surface;
   a reflector located adjacent the substrate and configured to substantially surround the semiconductor light emitting device chip; and
   a wavelength converting material and a light diffusing material located adjacent the reflector, wherein
      the semiconductor light emitting device chip is configured to emit light only from the top surface,
      a first light transmitting resin layer containing the wavelength converting material is located only on the top surface of the semiconductor light emitting device chip and is spaced from and does not substantially extend onto the side surface of the semiconductor light emitting device, the first light transmitting resin layer consists essentially of light transmitting resin and the wavelength converting material, and the first light transmitting resin layer is coated and cured on the top surface of the semiconductor light emitting device chip such that a mid portion of the first light transmitting resin layer bulges upward and away from the top surface of the semiconductor light emitting device chip due to surface tension; and
      a second light transmitting resin layer consists essentially of light transmitting resin and the light diffusing material, and the second light transmitting resin layer is located adjacent the reflector and over the first light transmitting resin layer.

2. The semiconductor light emitting apparatus according to claim 1, wherein:
   the reflector has a step in an upper part of an inner surface thereof; and
   a light diffusion sheet including the light diffusing material is located on the step so as to cover an interior of a recess in the reflector.

3. The semiconductor light emitting apparatus according to claim 2, wherein an inert gas is sealed in the recess of the reflector.

4. The semiconductor light emitting apparatus according to claim 3, wherein the reflector has a height 1.0 to 2.0 times a height of the semiconductor light emitting device chip, wherein the height of the semiconductor light emitting device extends normally from the bottom surface to the top surface of the semiconductor light emitting device and is substantially parallel with the height of the reflector which extends normally from a bottom surface of the reflector to a top surface the reflector, the top surface of the reflector located immediately adjacent and at an angle greater than zero with respect to an inner wall portion of the reflector which substantially surrounds the semiconductor light emitting device.

5. The semiconductor light emitting apparatus according to claim 2, wherein the reflector has a height 1.0 to 2.0 times a height of the semiconductor light emitting device chip, wherein the height of the semiconductor light emitting device extends normally from the bottom surface to the top surface of the semiconductor light emitting device and is substantially parallel with the height of the reflector which extends normally from a bottom surface of the reflector to a top surface the reflector, the top surface of the reflector located immediately adjacent and at an angle greater than zero with respect to an inner wall portion of the reflector which substantially surrounds the semiconductor light emitting device.

6. The semiconductor light emitting apparatus according to claim 2, wherein the wavelength converting material is a fluorescent material.

7. The semiconductor light emitting apparatus according to claim 3, wherein the wavelength converting material is a fluorescent material.

8. The semiconductor light emitting apparatus according to claim 1, wherein the reflector has a height 1.0 to 2.0 times a height of the semiconductor light emitting device chip, wherein the height of the semiconductor light emitting device extends normally from the bottom surface to the top surface of the semiconductor light emitting device and is substantially parallel with the height of the reflector which extends normally from a bottom surface of the reflector to a top surface the reflector, the top surface of the reflector located immediately adjacent and at an angle greater than zero with respect to an inner wall portion of the reflector which substantially surrounds the semiconductor light emitting device.

9. The semiconductor light emitting apparatus according to claim 8, wherein the wavelength converting material is a fluorescent material.

10. The semiconductor light emitting apparatus according to claim 1, wherein the wavelength converting material is a fluorescent material.

* * * * *